(12) United States Patent
Shanan

(10) Patent No.: US 8,294,493 B2
(45) Date of Patent: Oct. 23, 2012

(54) LOW-POWER FREQUENCY DIVIDERS

(75) Inventor: Hyman Shanan, Douglas (IE)

(73) Assignee: Analog Devices, Inc., Norwood, MA (US)

( * ) Notice: Subject to any disclaimer, the term of this patent is extended or adjusted under 35 U.S.C. 154(b) by 178 days.

(21) Appl. No.: 12/729,451

(22) Filed: Mar. 23, 2010

(65) Prior Publication Data

US 2011/0234293 A1    Sep. 29, 2011

(51) Int. Cl.
  *H03K 21/00* (2006.01)
(52) U.S. Cl. ........................................................ 327/115
(58) Field of Classification Search .................. None
  See application file for complete search history.

(56) References Cited

U.S. PATENT DOCUMENTS

| | | | |
|---|---|---|---|
| 5,646,462 A * | 7/1997 | Cortes et al. | 307/127 |
| 6,771,729 B1 * | 8/2004 | Takahashi et al. | 375/376 |
| 6,937,075 B2 * | 8/2005 | Lim et al. | 327/157 |
| 7,161,395 B2 | 1/2007 | Xie | |
| 7,522,008 B2 | 4/2009 | Jang et al. | |
| 2006/0164712 A1 * | 7/2006 | Ishibashi | 359/239 |

OTHER PUBLICATIONS

Kluge, W., et al. "*A Fully Integrated 2.4-GHz IEEE 802.15.4-Compliant Transceiver for Zigbee™ Applications*", IEEE Journal of Solid-State Circuits, vol. 41, No. 12, Dec. 2006, 10 pages.

* cited by examiner

*Primary Examiner* — Lincoln Donovan
*Assistant Examiner* — Sibin Chen
(74) *Attorney, Agent, or Firm* — Knobbe, Martens, Olson & Bear, LLP

(57) ABSTRACT

A bias-shaping circuit for adjusting power consumption in a frequency divider to a temperature-dependent minimum includes a temperature-dependent bias source for producing a temperature-dependent bias. The bias is combined with an input signal to create an output bias. The output bias changes in response to a change in temperature to compensate for at least a portion of a temperature-induced change in the frequency divider, thereby adjusting power consumption in the frequency divider to a temperature-dependent minimum.

25 Claims, 15 Drawing Sheets

LOW-POWER FREQUENCY DIVIDERS

TECHNICAL FIELD

Embodiments of the invention generally relate to frequency divider circuits, and, more specifically, to low-power, high-frequency divider circuits such as the ones used in wireless communication transceivers.

BACKGROUND

Wireless communication transceivers are commonly used in applications that require very low levels of power consumption, such as in smart electric grid wireless networks, wireless sensor networks, point-to-point data links, data streaming applications, and mobile/hand-held communications devices. A wireless sensor network, for example, may budget the power consumption of a wireless transceiver (operating in receive mode) to a maximum of only 22 mW.

The frequency of a wireless communication transceiver plays a large role in the transceiver's power consumption. Frequency planning in wireless transceivers, therefore, is a critical design aspect and must be considered when the transceiver architecture is chosen. An important aspect of frequency planning is the relationship between the operating frequency range of the transceiver and the fundamental frequency of the transceiver's local oscillator (LO), especially for direct-conversion (i.e., homodyne) receivers and transmitters.

The LO frequency of direct-conversion transceivers is typically chosen to be twice (or other multiple of) the operating frequency of the transceiver. This multiplication of LO frequency minimizes the radiation emitted by the LO to the receiver inputs and thus avoid the generation of detrimental time-varying offsets capable of saturating the transceiver. The multiplied LO frequency also reduces the "frequency pulling effect" of the LO by the turning on of the transceiver's high power amplifier. Because the LO frequency is multiplied, a frequency divider is needed downstream to divide the LO frequency by two (or other multiple) to generate the correct frequency for the receiver or transmitter circuitry. The frequency divider may serve other functions in the transceiver, such as generating quadrature signals necessary for the receiver and the transmitter.

A frequency divider is typically the most power-consuming component in a wireless transceiver at least because the frequency divider operates at the highest frequency in the transceiver. Furthermore, prior-art frequency dividers function at a fixed operating/bias point. Because the frequency divider must operate reliably at a worst-case condition (e.g., at high temperature, low voltage, and a slow process corner), the fixed operating/bias point must be selected at the worst-case point. This design or safety margin is exacerbated by inaccuracies in computer modeling and simulation of the circuit, which must also be accounted for. A prior-art frequency divider operating under typical or fast conditions, therefore, will consume more power than is necessary for reliable functionality—in some cases, as much as 60% more than necessary.

Another source of power consumption in prior-art wireless communication transceivers comes from LO buffers used to distribute the LO signal to the frequency dividers. These LO buffers also operate at twice the operating frequency of the transceiver and, therefore, also consume a substantial amount of power.

Although the power consumption of a frequency divider may be reduced by the use of certain components, such as inductive elements that resonate with (and reduce the effects of) parasitic capacitances, these components are expensive to include due at least to their large size (which may occupy an unacceptably large portion of expensive silicon area). Clearly, a need exists for a frequency divider that is both low-power and low-cost.

SUMMARY

Embodiments of the current invention reduce the power consumption of a frequency divider by adjusting or shaping a bias current used therein in response to a change in ambient temperature. The bias-current shaping technique for the frequency divider includes a bias-current generation circuit for providing a temperature-dependent bias current that, when combined with an incoming LO signal, shapes the frequency divider bias such that the frequency divider's current (and thus power) consumption across all process and temperature corners are significantly reduced. In one embodiment, a programmable bias current for the frequency divider is used. After the circuit has been manufactured, the programmable bias current may be used to determine the minimum current consumption for the circuit across process corners, thereby avoiding the dependency on conservative transistor models for these process corners. In another embodiment, the power-hungry LO buffers are removed from the wireless transceiver, and the LO frequency is distributed without amplification. An impedance transformation network composed of capacitors may be added to reduce the resistive loading caused by the LO lines on the VCO LC tank. The techniques described herein for shaping a bias current may be applied to the shaping of a bias voltage or other bias parameter, as one of skill in the art will understand, and are not limited to any particular kind of current or voltage bias source.

In a first aspect, a bias-shaping circuit adjusts power consumption in a frequency divider to a temperature-dependent minimum. The bias-shaping circuit includes an input node for receiving an input signal and a temperature-dependent bias source for producing a temperature-dependent bias. A summing circuit produces an output bias including a sum of at least a portion of the input signal and the temperature-dependent bias. An output node provides the output bias to a frequency divider for control thereof; the output bias, in response to a change in temperature, adjusts to compensate for at least a portion of a temperature-induced change in the frequency divider, thereby adjusting power consumption in the frequency divider to a temperature-dependent minimum.

In various embodiments, the temperature-induced change in the frequency divider may include a change in a rise time of an output of the frequency divider, a change in a fall time of the output of the frequency divider, and/or a change in a magnitude of a voltage swing of the output of the frequency divider. Compensating for at least a portion of the temperature-induced change may include at least one of maintaining the rise time, maintaining the fall time, or maintaining the magnitude of the voltage swing (i.e., maintaining the performance of the frequency divider) and/or increasing the rise time, increasing the fall time, and/or decreasing the magnitude of the voltage swing (i.e., decreasing the performance of the frequency divider).

The change in temperature may include an increase or decrease in temperature. The temperature-dependent bias source may be one of a voltage or current source. The output bias may be one of an output voltage or current. The portion of the input signal may include an AC component of the input signal. A bias value of the temperature-dependent bias source may vary in accordance with a received control value. A temperature-independent bias source may modify the output bias. A bias value of the temperature-independent bias source may vary in accordance with a received control value, and the control value may be modified after manufacture of the frequency divider. A look-up table may vary the bias value of the temperature-dependent bias source based on a measured temperature. The frequency divider may include a D-type flip-flop.

The input signal may include a non-rail-to-rail time-varying signal, may be received directly from an output of a voltage-controlled oscillator, and/or may be attenuated to a desired level. The input signal may be received from the voltage-controlled oscillator through an impedance-transformation network and/or local-oscillator distribution lines. The input signal may be received from a buffer including a second temperature-dependent bias source for producing a second temperature-dependent bias, a second summing circuit for producing a second output bias (including a sum of at least a portion of a buffer input signal and the second temperature-dependent bias), and an output node for providing the second output bias to the buffer for control thereof; the second output bias adjusts in response to the change in temperature to compensate for at least a portion of a temperature-induced change in the buffer, thereby adjusting power consumption in the buffer to a temperature-dependent minimum.

In another aspect, a method for adjusting power consumption in a frequency divider to a temperature-dependent minimum begins with receiving an input signal and producing a temperature-dependent bias. At least a portion of the input signal and the temperature-dependent bias are combined to thereby create an output bias. A frequency divider is controlled with the output bias to thereby compensate for at least a portion of a temperature-induced change in the frequency divider, thereby adjusting power consumption in the frequency divider to a temperature-dependent minimum.

In various embodiments, the temperature-induced change includes a change in a rise time of an output of the frequency divider, a change in a fall time of the output of the frequency divider, and/or a change in a magnitude of a voltage swing of the output of the frequency divider. Compensating for at least a portion of the temperature-induced change may include maintaining the rise time, maintaining the fall time, and/or maintaining the magnitude of the voltage swing (i.e., maintaining the performance of the frequency divider) and/or increasing the rise time, increasing the fall time, or decreasing the magnitude of the voltage swing (i.e., decreasing the performance of the frequency divider).

The portion of the input signal may include an AC component of the input signal. The input signal may include a non-rail-to-rail time-varying signal, may be received directly from a local oscillator, and/or may received from the voltage-controlled oscillator through an impedance-transformation network and/or local-oscillator distribution lines. The input signal may be attenuated to a desired level, and the temperature-dependent bias may be modified in accordance with an output of a sensor comprising a temperature sensor and/or frequency monitor.

These and other embodiments, along with advantages and features of the embodiments of the present invention herein disclosed, will become more apparent through reference to the following description, the accompanying drawings, and the claims. Furthermore, it is to be understood that the features of the various embodiments described herein are not mutually exclusive and may exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

Figure 1:
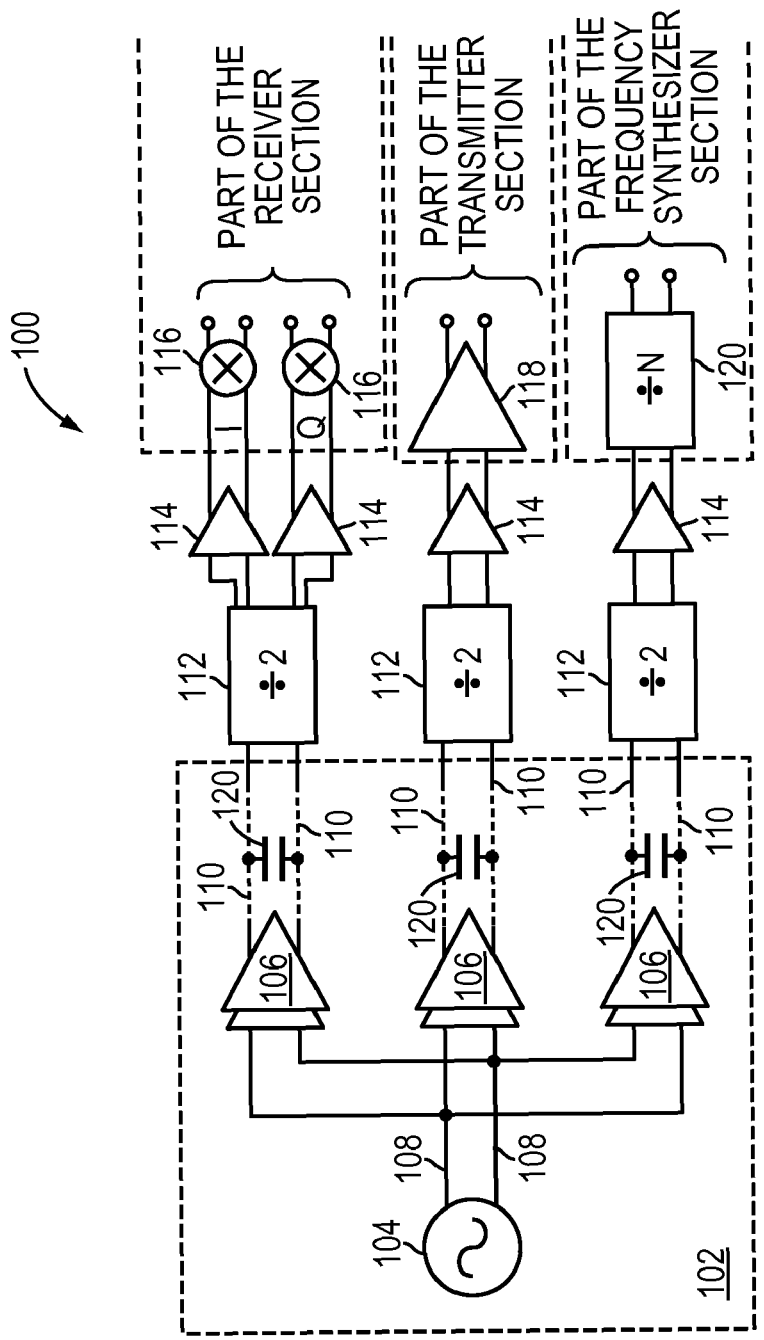
FIG. 1 is a block diagram of a prior-art LO path (or section) of a transceiver.

FIG. 1 shows a block diagram of a section 100 of a radio-frequency (RF) transceiver 100 that includes a prior-art local-oscillator (LO) section 102. The LO section 102 includes a voltage-controlled oscillator (VCO) 104 that operates at a frequency approximately equal to twice the operating frequency range (in other words, twice the midpoint of the range) of the RF transceiver 100. LO buffers 106 distribute the VCO output signal 108 over LO distribution lines 110 to various sections of the transceiver 100, such as to frequency dividers 112. The LO distribution lines 110 have an intrinsic capacitance, represented by the equivalent capacitive elements 120, that present a capacitive load to the outputs of the VCO 104. A second stage of buffers 114 boosts the divided signal that is output from the frequency dividers 112 for use in various components in the transceiver 100, such as a receiver mixer 116, a transmitter power amplifier 118, and/or frequency synthesizer prescalar circuitry 120.

The LO buffers 106 may be positioned proximate the VCO 104 (e.g., near the beginning of the LO distribution lines 110). The LO distribution lines 110 may span a large distance, depending on the position of the frequency dividers 112 relative to the VCO 104. The LO buffers 106 close to the VCO 104 wholly or partially isolate the VCO 104 from the load of the distribution lines 110. The LO buffers 106 may be implemented using active devices, which may occupy a small die area but consume a large amount of power. In an alternative implementation, the transceiver 100 power consumption may be reduced through the use of a single, tuned VCO buffer (not shown) that includes an inductor that resonates with the parasitic capacitance of the LO distribution lines 110 at the VCO frequency. As described above, this reduction in power consumption comes at the cost of an increase in silicon area required by the inductor.

The LO buffers 106 provide a rail-to-rail voltage swing at the input of the frequency dividers 112, thereby completely or partially offsetting the effect on the voltage swing by the equivalent capacitance 120 of the LO distribution lines 110.

For example, the equivalent capacitance 120 may slow the rise and/or fall times of a changing voltage signal on the LO distribution lines 110, and the LO buffers 106 may compensate for this effect by providing a greater drive strength to the voltage signal. In some cases, depending on the size and distribution of the equivalent capacitance 120, additional LO buffers 106 may be distributed along the LO distribution lines 110 to thereby reduce the total power consumption of the LO buffers 106.

Because the LO buffers 106 operate at twice the operating frequency of the transceiver 100, the LO buffers 106 may consume a substantial amount of power. For example, an LO buffer 106 implemented as a two-stage differential buffer may receive a 3.0 volt peak-to-peak differential signal from the VCO 104 and may drive a 50 fF differential capacitive load with a 2.4 volt peak-to-peak differential swing. The LO buffer 106 in this example, therefore, will consume 2.5 mA of current at 4.8 GHz. Because at least two LO buffers 106 are needed in either RX or TX mode, the total LO buffer current consumption is 5.0 mA, or 28% of the power consumption budget.

The prior-art frequency divider 112 further includes a safety margin to prevent or reduce "fail-hard" errors (i.e., failures in which the frequency divider 122 functionally fails, rather than having merely a degraded performance). For example, a frequency divider 112 required to operate with an input frequency of 4.8 GHz will typically require a 15-20% design safety margin on its input frequency at the worst-case process/design corner to guarantee its reliable functionality.

The safety margin must also account for the inability to control the behavior of the frequency divider 112 after it has been manufactured and the resultant inability to adjust the circuit to account for changing environmental parameters (e.g., temperature). While some adjustment in speed may be made by increasing the amplitude of the VCO output signal 108, this increase produces only a limited increase in the speed of the frequency divider 112. Furthermore, unlike other architectures that use a controllable current source, low-power frequency divider components (such as the D-type flip-flop shown in FIG. 3A, below) typically eliminate the controllable current source to, e.g., provide more voltage headroom, and thus eliminate another means to change the speed of the frequency divider. Note, however, that some frequency divider circuits may use a fixed current source.

In addition, the safety margin in prior-art frequency dividers is used to account for errors in circuit and transistor modeling and simulation. The capacitance of the individual transistors is often poorly modeled, especially at high RF frequencies where relatively accurate S-parameters are required for the transistors being used. Unless very specific transistor dimensions are used, these parameters are not readily available for most transistor models thereby limiting the flexibility of the design.

In addition, the transistor model parameters which correspond to the slow and fast process corners may be conservatively set by the process foundry to minimize the design yield loss. This conservative approach leads to transistor simulation parameters that are inferior to the actual behavior of the transistors at, for example, the extremes of the process corners. While this approach may be beneficial from a manufacturing point of view, it is not suitable for ultra-low-power RF transceiver design, in which the exact transistor model parameters need to be considered to avoid any unnecessary power to be consumed in the design. For example, a 15-20% design margin on the input frequency of the frequency divider, necessary in the worst-case process/design corner of the divider, in addition to the conservative transistor simulation models, leads to as much as a 60% increase in power consumption of the frequency divider.

Figure 2:
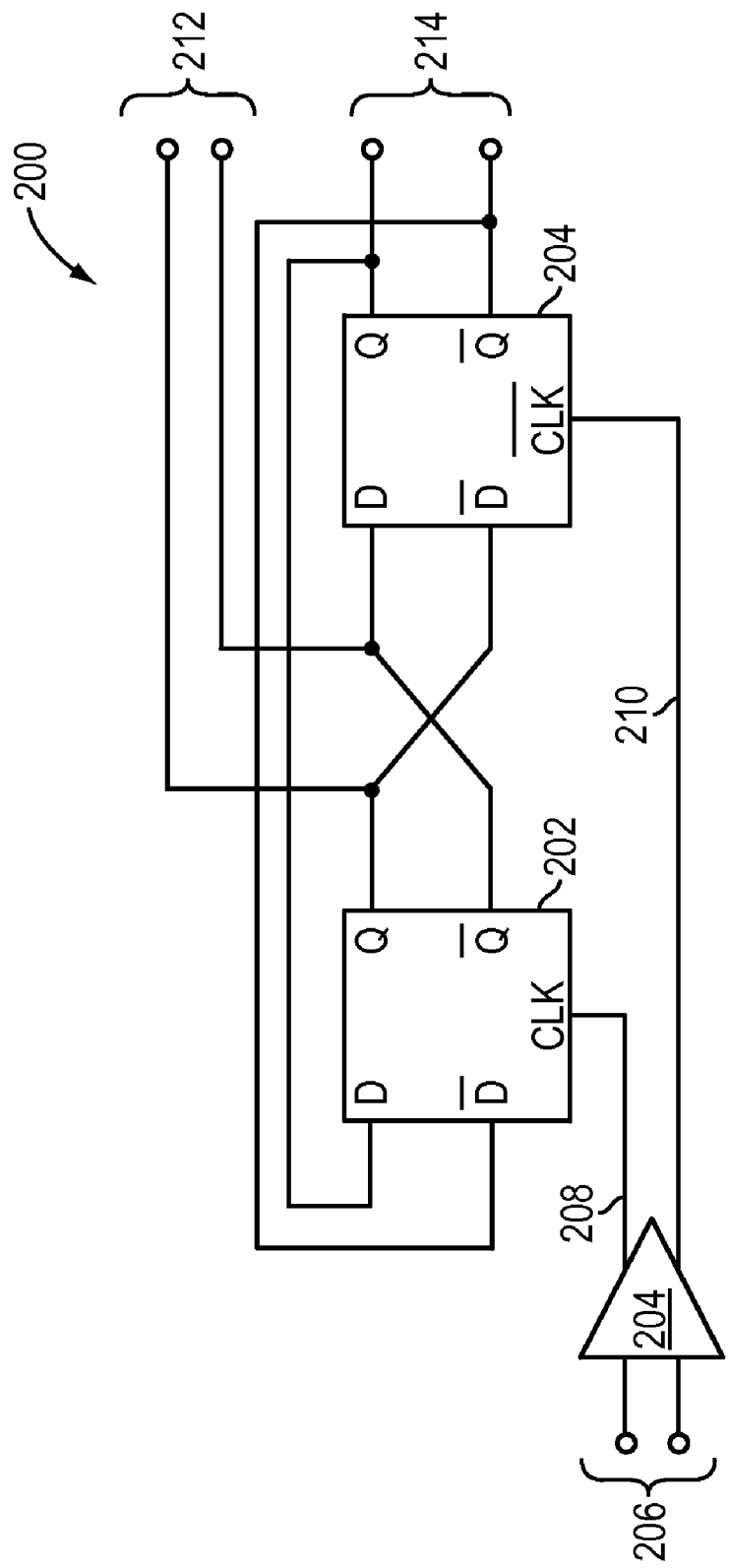
FIG. 2 is a block diagram of a divide-by-two frequency divider based on two D-type flip-flops.

FIG. 2 shows a block diagram of an exemplary divide-by-two circuit 200 that may be used as a frequency divider 112. Two D-type flip-flops 202, 204 are connected in a master-slave configuration. A differential buffer 204 receives a differential clock signal 206 and provides a buffered clock signal 208 to the master flip-flop 202 and an inverted clock signal 210 to the slave flip-flop 204. The differential outputs 212, 214 have a frequency equal to one-half of the frequency of the input differential clock signal 206, and may be used as, e.g., quadrature inputs I, Q to the receiver mixer 116. Another class of frequency dividers, injection-locked frequency dividers, uses an inductive load that may lead to lower power consumption; as noted above, however, the use of an inductor incurs a substantial increase in silicon area and is not suitable for ultra-low-cost transceivers.

Figure 3A:
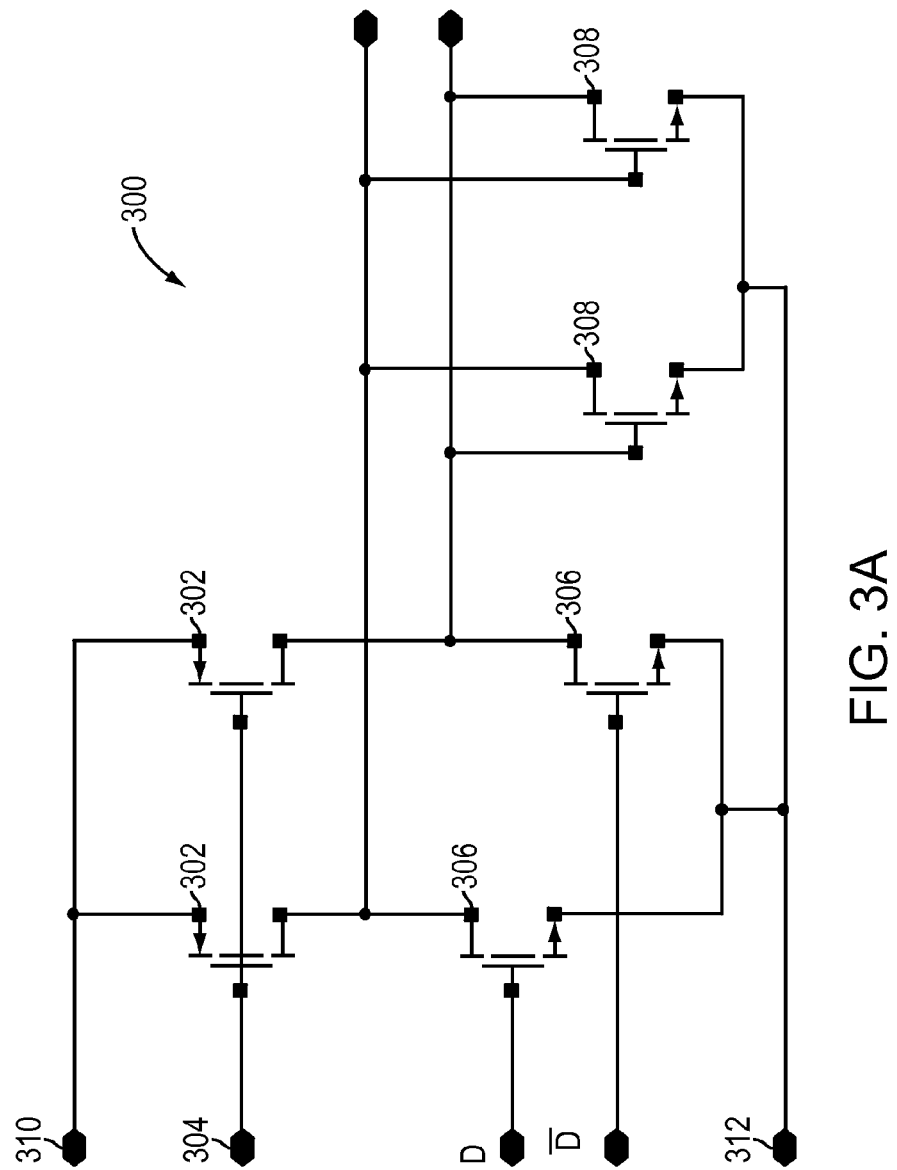
FIG. 3A is a schematic diagram of a D-type flip-flop.

FIG. 3A is transistor-level schematic showing one embodiment 300 of the D-type flip-flop 202, 204. Pre-charge transistors 302 receive an input clock signal 304, and evaluation transistors 306 receive D and D̄ inputs. Latch transistors 308 store the evaluated input signal, and power 310 and ground 312 signals bias the circuit 300. The D-type flip-flop implementation 300 may exhibit low power consumption and the ability to function on a low supply voltage 310 (e.g., 1.8 volts). The present invention, however, is not limited to any particular D-type flip-flop, and any suitable low-power D-type flip-flop may be used.

Figure 3B:
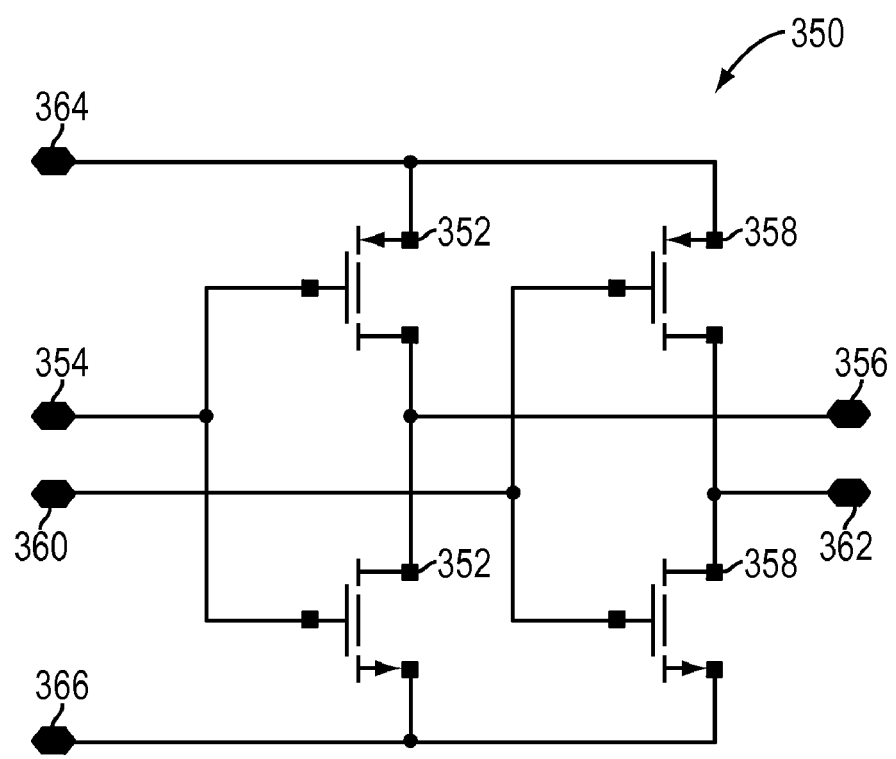
FIG. 3B is a schematic diagram showing an LO buffer.

FIG. 3B is a transistor-level schematic showing one embodiment 350 of the differential buffer 204. Buffer transistors 352 receive a clock signal 254 and produce a buffered clock signal 356, and buffer transistors 258 receive an inverted clock signal 360 and produce a buffered inverted clock signal 362. The circuit 350 is powered by power 364 and ground signals 366, which may be the same power and ground signals 310, 312 as above or may be different signals. Like the D-type flip-flop implementation 300, the differential buffer implementation 350 may feature low power consumption, but the present invention is not limited to any particular differential buffer implementation.

Figure 4:
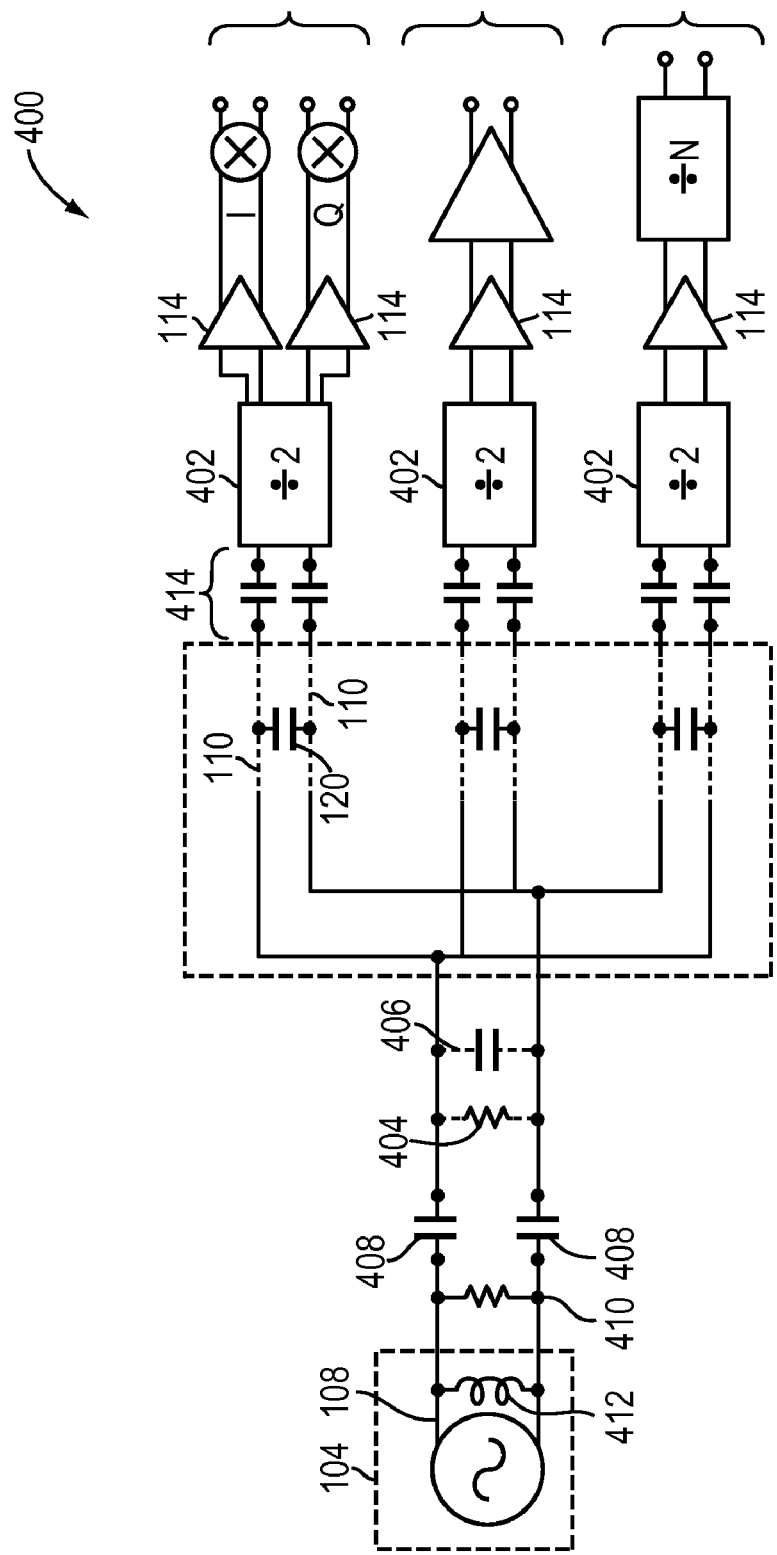
FIG. 4 is a block diagram of a low-power LO path including a low-power frequency divider in accordance with an embodiment of the invention.

FIG. 4 illustrates a block diagram of a section of an RF transceiver 400 that includes low-power, high-frequency divider circuits 402 in accordance with one embodiment of the present invention. As described above, the RF transceiver 400 does not include the LO buffers 106 that operate at twice the operating frequency of the transceiver 400. Instead, the adaptively biased frequency divider circuit 402 increases the frequency divider current consumption in the worst case temperature corner (to guarantee the circuit operation at this corner) and decreases its current consumption in other temperature corners while maintaining the lowest possible current consumption under nominal conditions. Furthermore, as described in greater detail below, the frequency divider circuit 402 may increase or decrease its current consumption on-the-fly to provide a bias level appropriate for the instantaneous voltage, temperature, and process conditions.

The VCO 104 may be designed using an LC tank circuit with a high quality factor (i.e., having low resistive losses and hence a higher parallel effective load resistance across the LC tank), allowing for very low power consumption and low noise performance. The LO distribution lines 110 deliver the VCO signal 108 to the frequency divider circuit 402. The resistive and capacitive losses associated with the LO lines 110 (represented in FIG. 4 by lumped equivalent elements 404 and 406, respectively) will, therefore, be directly seen by the VCO 104. Degradation in this high quality factor may be minimized or avoided by adding capacitors 408 to act as an impedance transformer. The impedance transformer capacitors 408 may be sized in accordance with the equivalent capacitance 406 to thereby transform the equivalent resistance 404 into a higher, load resistance 410. The higher load resistance 410 may reduce the resistive loss seen by the VCO LC tank circuit. The equivalent capacitance 406 may also be transformed by the impedance transformer capacitors 408, and this transformed capacitance may be wholly or partially absorbed by the inductor 412 of the LC tank circuit. The absorbed capacitive load, in addition to the local resistive load 410, may slightly degrade the intrinsic quality factor of the LC tank in the VCO 104. The power consumption of the VCO 104 may increase by approximately 5% to counteract this degradation in its quality factor, resulting in an acceptable increase in current consumption (on the order of, e.g., 0.1 mA). Coupling capacitors 414 may be used to further control power consumption by, for example, optimizing the load on the LC tank. The coupling capacitors 414 may be programmed to an appropriate value after the chip has been fabricated using, for example, a capacitor digital-to-analog converter.

Because the capacitance 406 of the LO distribution lines 110 may be considered part of the LC tank circuit in the VCO 104, the VCO 104 may be more susceptible to noise produced by, e.g., spurious nearby mixed-signal components. Proper shielding and physical isolation between noisy circuits and the LO distribution lines 110 may be employed to minimize or eliminate coupled noise and thereby minimize or eliminate degradation in the spurious performance of the VCO 104.

Figure 5:
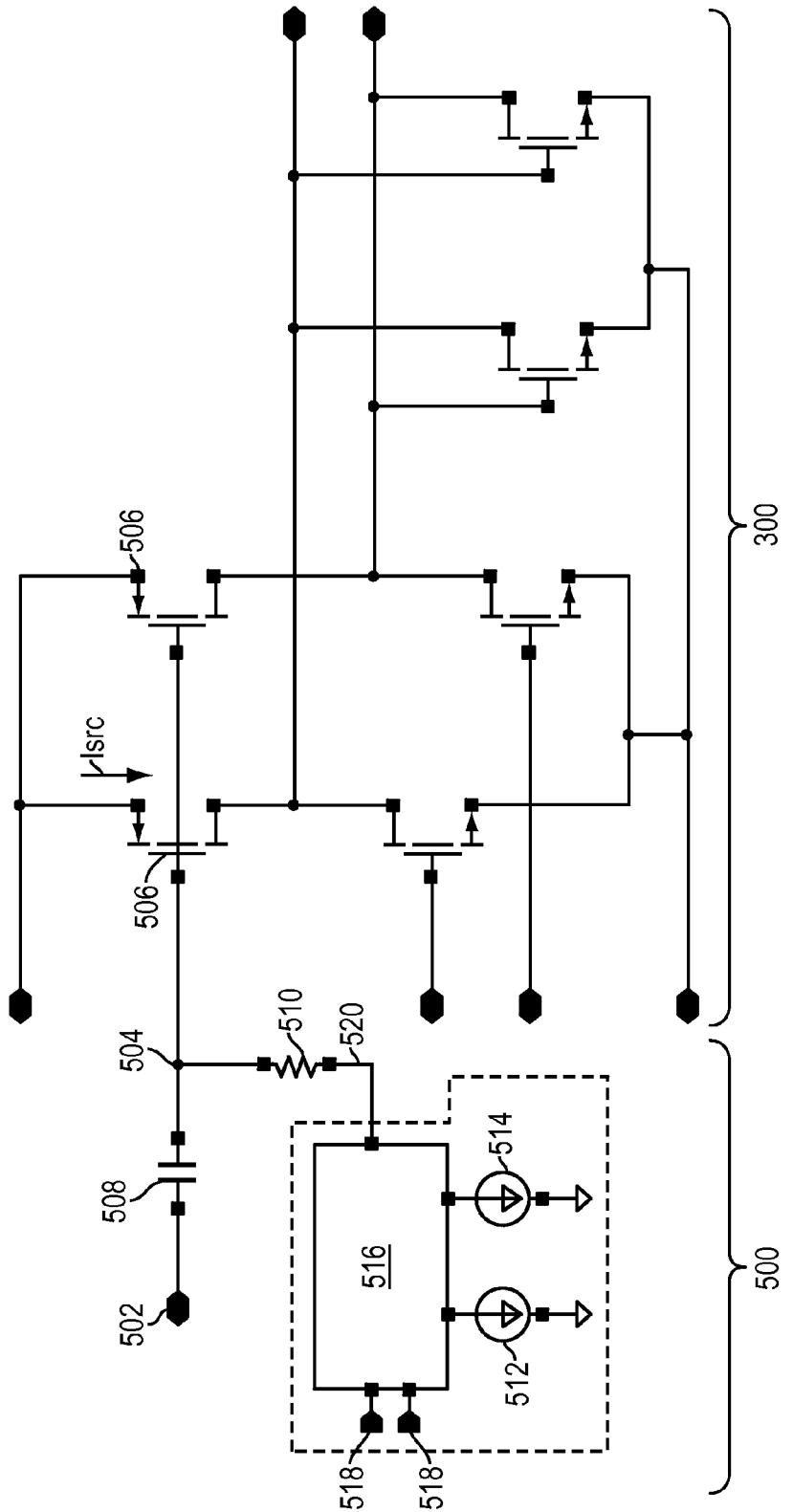
FIG. 5 is a schematic diagram of bias control circuitry for a frequency divider in accordance with an embodiment of the invention.

FIG. 5 illustrates an exemplary schematic of a bias generator circuit 500 for adaptively controlling the power consumption of a D-type flip-flop 300 used in the frequency divider 402. As discussed above, the frequency divider 402 may be subject to operational variations caused by, e.g., process and temperature variations of the frequency divider 402. A prior-art frequency divider, such as the frequency divider 112 shown in FIG. 2 above, must have a static operating point usable under any anticipated condition, including a worst-case condition. In contrast, in one embodiment, the bias generator circuit 500 shapes the DC bias voltage applied to the gates of the current-source transistors 506 to compensate for a temperature-induced change in a performance level of the frequency divider 402, thereby minimizing the overall power consumption of the frequency divider 402.

In general, the bias generator circuit 500 receives a non-rail-to-rail signal (i.e., a voltage swing which is not Vdd to Vss) at its input 502 and adjusts a bias voltage at a bias node 504 to center the incoming input signal around an advantageous center voltage. The rest of the D-type flip-flop 300 functions as described above with reference to FIG. 3A. In one embodiment, the non-rail-to-rail input voltage 502 is provided by the elimination of the LO buffers 106 from the RF transceiver 400. As a result of this elimination, the non rail-to-rail voltage swing is generated by the VCO 104 through the LO distribution lines 110. In other embodiments, the LO buffers 106 are not eliminated but merely reduced in size and drive strength. A tradeoff may be made between a larger swing and/or faster rise/fall times on the input voltage 502 (which may lead to more power consumption) and other circuit factors, such as noise tolerance. For example, an RF transceiver 400 may be designed to operate in a noisy environment and may therefore feature a non-rail-to-rail input voltage 502 that has larger amplitude than would otherwise be required. The present invention is not limited to any particular configuration of LO buffers 106, however, and is compatible with any LO frequency voltage distribution scheme that delivers an input voltage 502 with a swing less than a local supply range. In addition, in one embodiment, the frequency divider 402 receives an input voltage 502 with a swing equal to or greater than the rail-to-rail voltage swing and scales down the input voltage 502 and/or ignores the portions greater than the local supply.

The voltage on the bias node 504 determines the amount of current $I_{src}$ flowing through the transistors 506, which act as voltage-controlled current sources. The voltage on the bias node 504 is determined by the incoming signal 502 and the operation of the bias-generator circuit 500, as described in greater detail below. An AC coupling capacitor 508, which may be used in conjunction with or instead of the coupling capacitor 414, allows only the AC component of the incoming signal to propagate to the bias node 504 and allows the DC component to be set by the bias-generator circuit 500.

The bias-generator circuit 500 includes two types of current sources: a proportional-to-absolute-temperature (PTAT) current source 512 and a zero-change-with-absolute-temperature (ZTAT) current source 514. The outputs of the PTAT 512 and ZTAT 514 current sources are mixed together with a certain ratio to thereby generate the DC bias component on the bias node 504. In one embodiment, a digital-to-analog converter (DAC) 516 controls the ratio by which the PTAT 512 and ZTAT 514 currents are mixed in accordance with digital inputs 518. In one embodiment, the DAC 516 is a 6-bit current-mode DAC, and the digital inputs 518 are each 6 bits wide. The present invention is not limited to any particular size or type of DAC, however, or even to any particular implementation of control circuit; any circuit that controls the ratio of mixing between the PTAT 512 and ZTAT 514 current sources is within the scope of the present invention.

The inputs 518 may be provided by a hardware register, by external pins, by setting fuses, or by any other read-write or read-only means of storing values. In one embodiment, the values of the inputs 518 are determined by computer simulations of the devices comprising the bias-generator circuit 500 and D-type flip-flop 300 at various process, voltage, and temperature corners. Alternatively, the values of the inputs 518 may be found by testing the bias-generator circuit 500 and D-type flip-flop 300 after they have been manufactured. One or more manufactured devices may be tested, and the values of the inputs 518 may be found by trial-and-error, by statistical modeling, or by any other similar method. In any case, various values of the inputs 518 may be tried in order to determine a desired relationship between ambient temperature and the bias produced by the bias-generator circuit 500. For example, in one embodiment, the values of the inputs 518 are selected such that, for any value of the input signal 502, a bias voltage is generated by the bias-generator circuit 500 minimizes the power consumed by the D-type flip-flop 300 while still ensuring reliable operation. If the selected values are incorrect, the D-type flip-flop 300 may either fail to function (at one extreme) or consume an unacceptable amount of power (at another extreme). In one embodiment, the ZTAT current 514 and inputs 518 are used to set the mid-point of the generated bias voltage on node 504 and the PTAT current 512 and inputs 518 are used to set the amount of adjustment to the bias voltage on node 504 in accordance with temperature variation given an input voltage swing desired or required by the D-type flip-flop 300.

An output 520 of the DAC 516 provides the result of mixing the currents output from the current sources 512, 514. A bias resistor 510 determines the DC component of the bias voltage by converting the currents 512, 514 into a voltage. In this embodiment, the bias voltage generated by the bias generator circuit 500 and the AC component of the input voltage 502 are summed by simply combining the voltages at the bias node 504—here, the summing circuit is merely the bias node 504. Any method or system for combining the signals may be used, however. The input and output biases may be any combination of voltages or currents, and may be combined in either the current or voltage domain. In an alternative embodiment, the AC component of the input voltage 502 is not summed with the generated bias currents or voltages. In this embodiment, the bias values are used directly by the frequency divider for temperature-dependent control thereof, and the input voltage is processed in a different portion of the D-type flip-flop 300 (or other frequency divider component).

Figure 6:
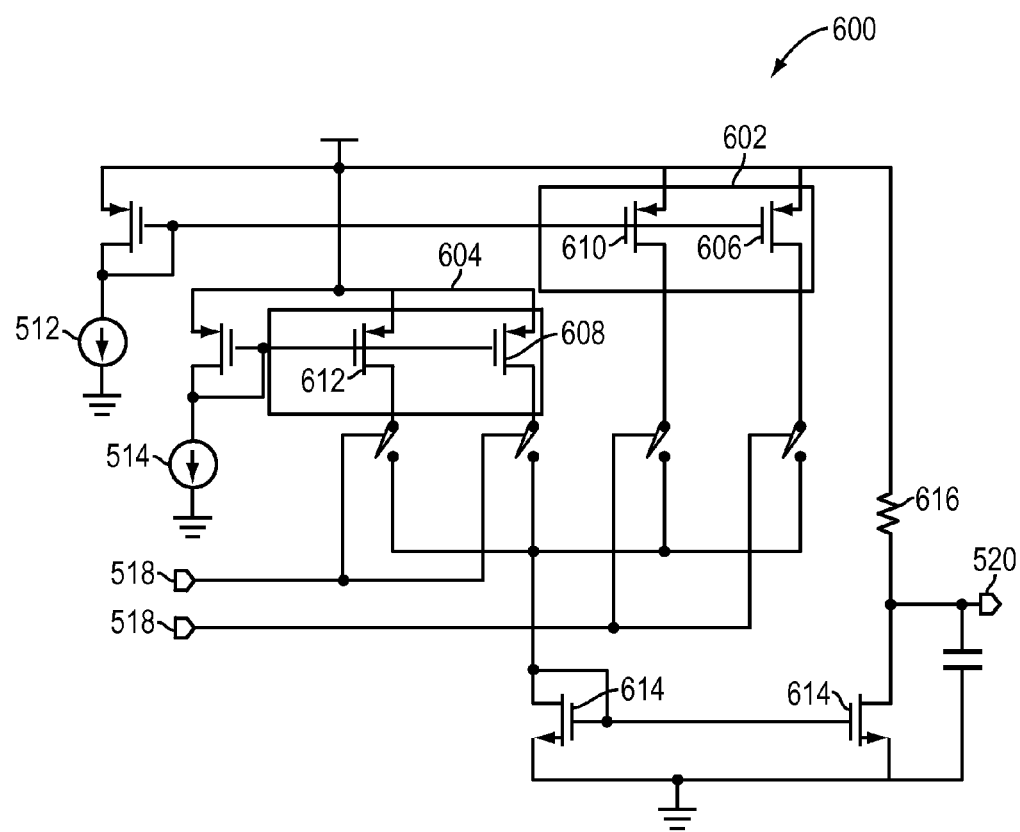
FIG. 6 is a schematic diagram of a bias-current generator in accordance with an embodiment of the invention.

FIG. 6 illustrates a schematic 600 of the bias-generator circuit 500, including a PTAT current source 512, a ZTAT current source 514, digital control signals 518, and an output 520, all as described above with reference to FIG. 5. The schematic 600 further includes a PTAT PMOS current mirror DAC 602 and a ZTAT PMOS current mirror DAC 604. In one embodiment, transistors 606, 608 are sixteen-bit arrays and transistors 610, 612 are four-bit arrays, but any appropriate size and/or number of transistors may be used to implement the DACs 602, 604. The output currents from both DACs 602, 604 are mixed in the current domain with a ratio determined by the digital input signals 518. The total current is then mirrored using an NMOS current mirror 614 whose output current feeds into an output resistor 616. In one embodiment, the output resistor 616 is a polysilicon resistor and is the same type of resistance used to generate the PTAT and ZTAT currents from the on-chip bandgap current reference.

In one embodiment, the LO buffers 106, described above, are also used with the bias-current shaping technique described with reference to FIG. 5. In this embodiment, each LO buffer 106 (or group thereof) includes its own temperature-dependent bias source and summing node for adding an incoming signal to be buffered. Like the frequency divider circuit described above, the LO buffer 106 may be modified on a temperature-dependent basis to minimize power consumption at a given temperature.

Figure 7:
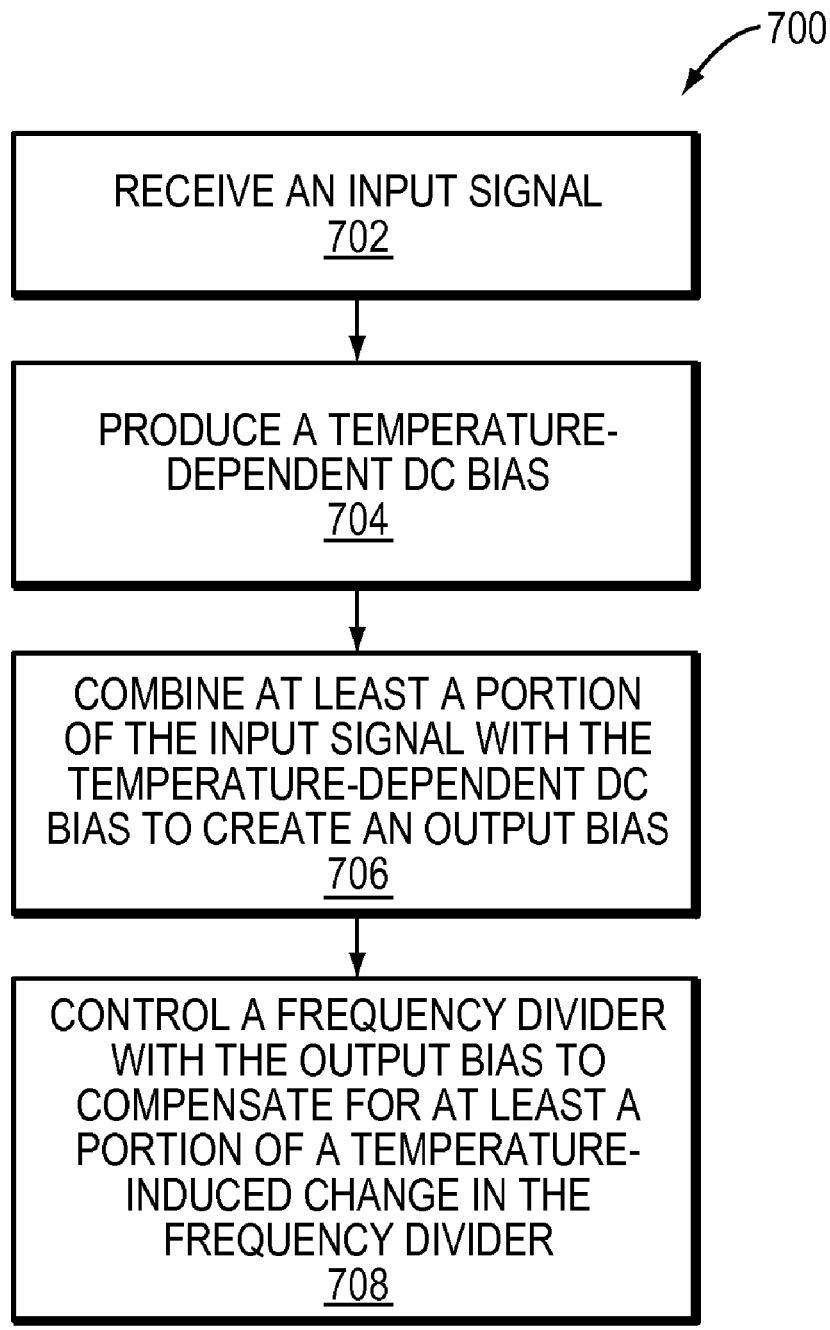
FIG. 7 is a flowchart illustrating a method for reducing power consumption in a frequency divider in accordance with an embodiment of the invention.

FIG. 7 is a flowchart illustrating, in one embodiment, a method 700 for reducing the power consumption of the frequency divider 402. A time-varying input signal is received (Step 702), which is, in one embodiment, the LO signal received over the LO distribution lines 110. The time-varying input signal may be, as described above, a non-rail-to-rail signal created by the removal or reducing the drive strength of the LO buffers 106. A temperature-dependent DC bias is produced (Step 704) by, for example, the PTAT current source 512 in the bias-generator circuit 500. In one embodiment, the temperature-independent ZTAT current source 514 is added to the PTAT current source 512. The temperature-dependent DC bias may be combined with at least a portion of the input signal (Step 706) by a summing circuit (which may be simply a common node between the two signals). In one embodiment, the portion of the input signal comprises a time-varying AC component of the input signal. A temperature-induced change in the frequency divider (e.g., a performance level such as the voltage swing or the rise and fall times of the output of the frequency divider) is compensated for by adjusting the output bias (Step 708) in accordance with a change in temperature to thereby lower the power consumption of the frequency divider to a temperature-dependent minimum. In other words, the output bias maintains (or lowers) the performance level of the frequency divider using the lowest required power consumption in various process, manufacturing, voltage supply, and temperature conditions.

Figure 8:
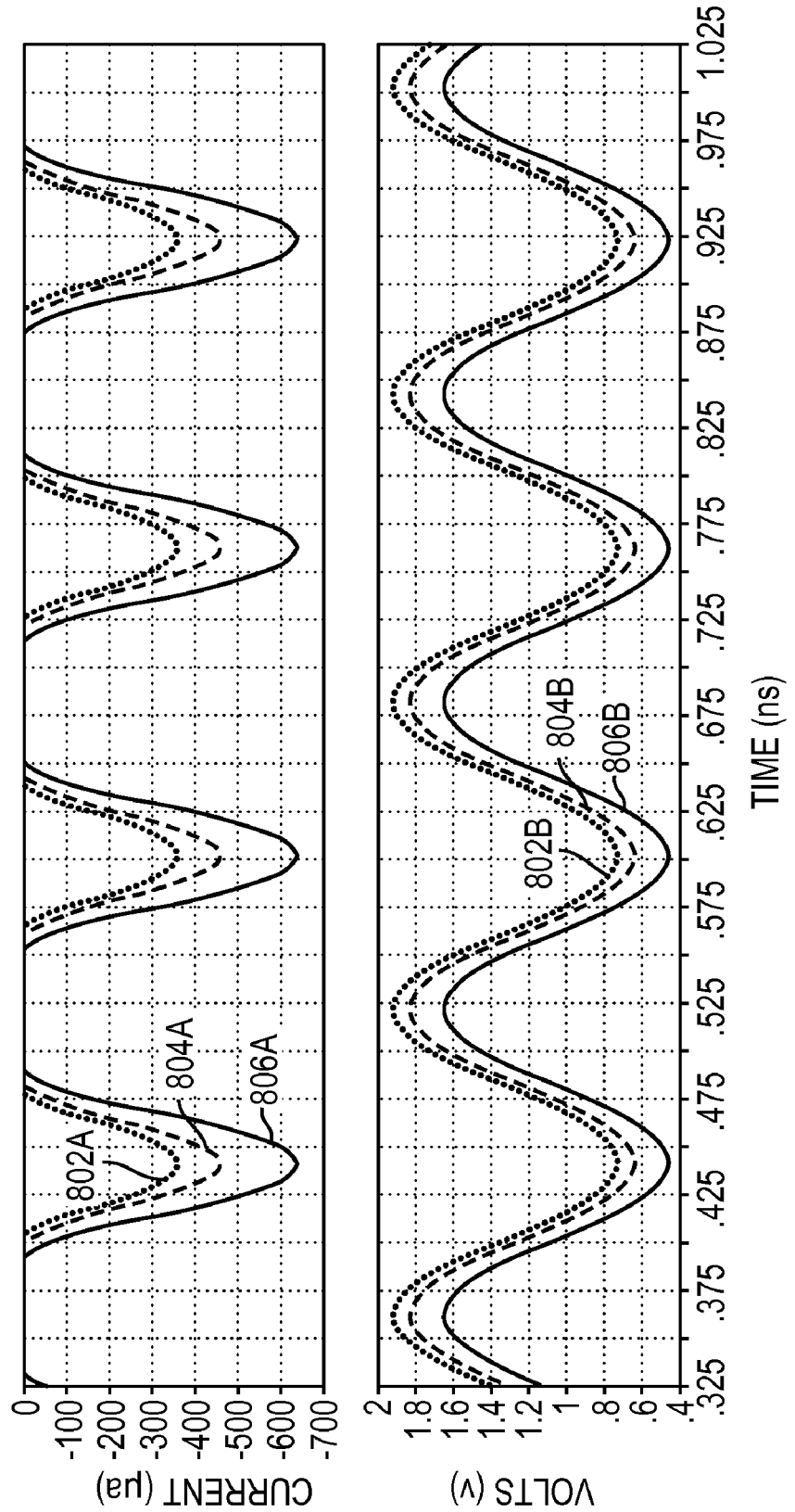
FIG. 8 is a graph illustrating bias current and voltage waveforms.

FIG. 8 is a graph showing the effect of changing the settings of the PTAT and ZTAT current DACs 602, 604 on the amount of current flowing in the current-source transistors 506. Three current curves 802A, 804A, and 806A are shown with the corresponding gate voltages 802B, 804B, and 806B that produced them. For example, applying the voltage curve 802B to the gates of the transistors 506 causes a current to flow through the transistors 506 as depicted in the current curve 802A. The current and voltage curves 802A, 802B correspond to a mid-range setting of the PTAT DAC 602 and a minimal setting of the ZTAT DAC 604.

The current and voltage curves change in accordance with different settings of the DACs 602, 604. For example, if the setting of the PTAT DAC 602 is increased to maximum, keeping the setting of the ZTAT DAC 604 the same, the voltage on the bias node 504 decreases as shown in the curve 804B and the current conducted by the current-source transistors 506 increases as shown in the curve 804A. If the setting of the PTAT DAC 602 is kept at maximum and the setting of the ZTAT DAC 604 is increased to its mid-range, the voltage on the bias node 504 decreases even further as shown in the curve 806B and the current conducted by the current-source transistors 506 further increases as shown in the curve 806A.

Thus, as described above, the bias voltage 504 generated in part by the bias circuit 500 affects the current flowing through the current-source transistors 506. This property may be used to shape the value of the DC bias voltage 504 to minimize the overall power consumption of the frequency divider 402. This shaping may be done across the entire temperature of operation of the transceiver 400. For example, at high temperatures, the transconductance of the transistors in the D-type flip-flop 300 may be lower than its nominal value and, hence, the transistors may require higher current consumption to maintain the functionality of the D-type flip-flop 300. At low temperatures, the transistor transconductances may be higher than their nominal values and, hence, less current consumption is required. The PTAT and ZTAT current sources 512, 514 combine to provide accordingly shaped bias currents. In one embodiment, the ZTAT current source 512 is configured to produce a nominal bias current and the PTAT current source 514 is configured to produce a temperature-dependent bias current. As the temperature of the transceiver 400 changes, the PTAT current source 514 produces a correspondingly changing current that biases the current-source transistors 506 appropriately, thereby minimizing the overall power consumption of the frequency divider 402.

Figure 9A:
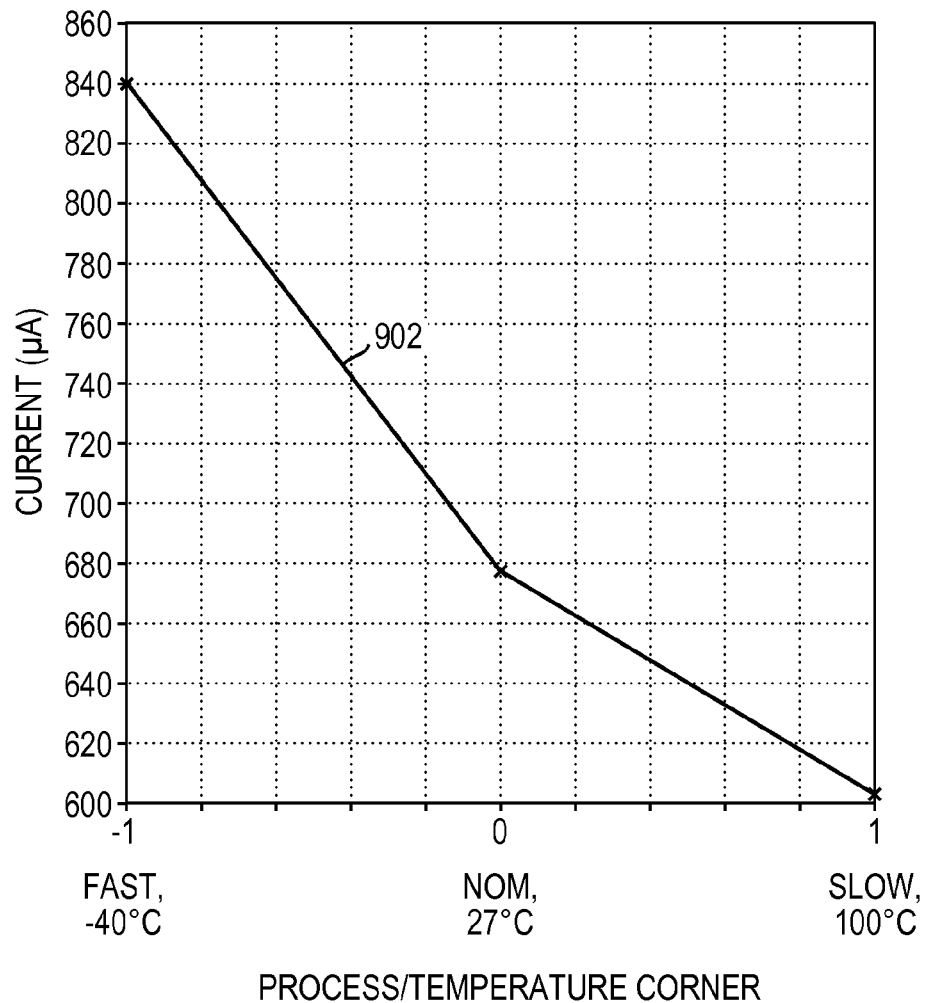
FIGS. 9A-9C are graphs illustrating simulated performance results for a temperature-independent frequency divider.
Figure 9B:
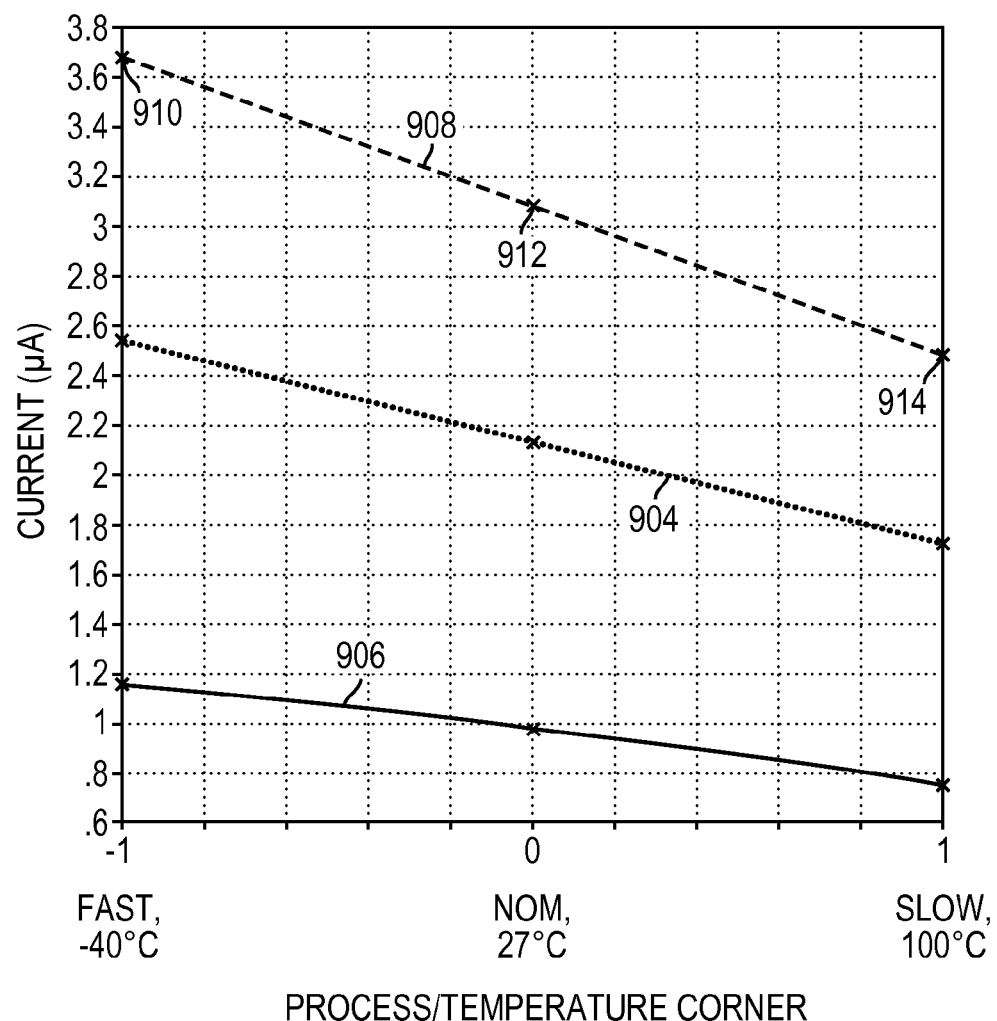
Figure 9C:
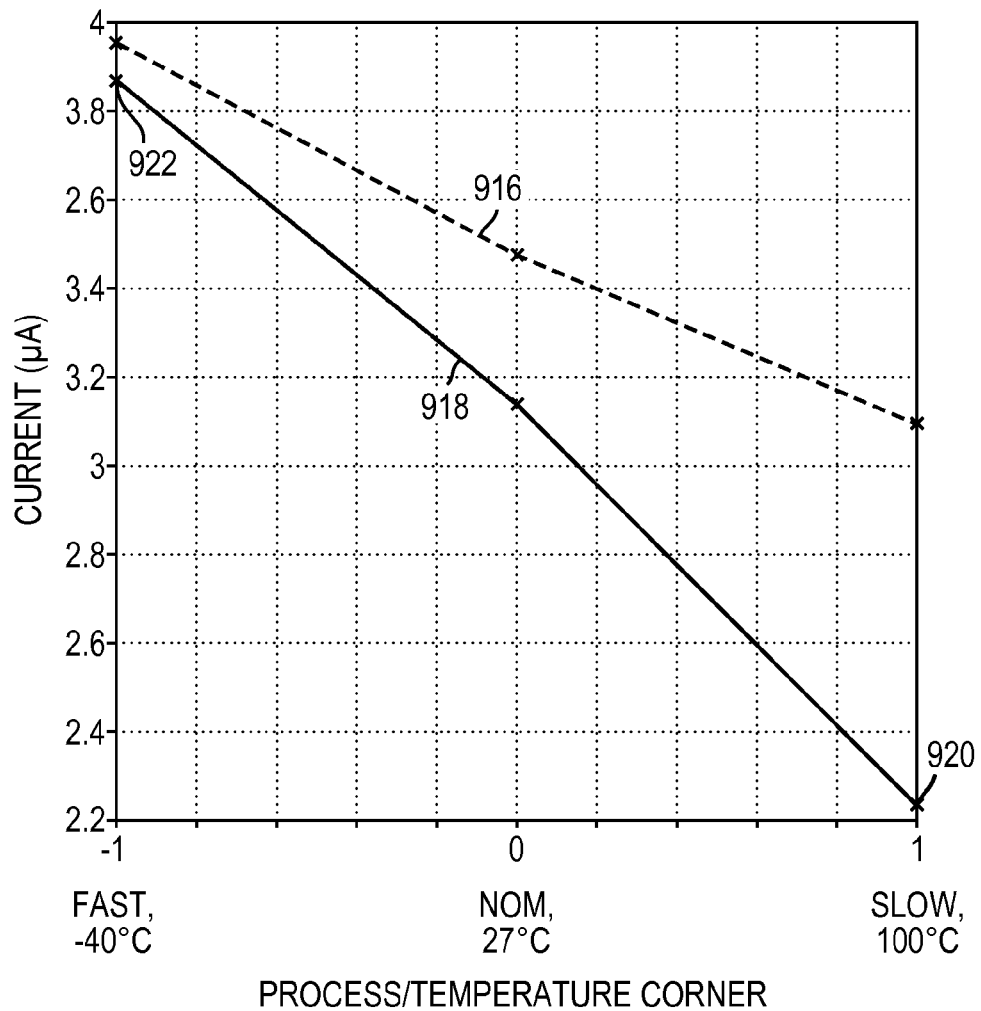
Figure 10A:
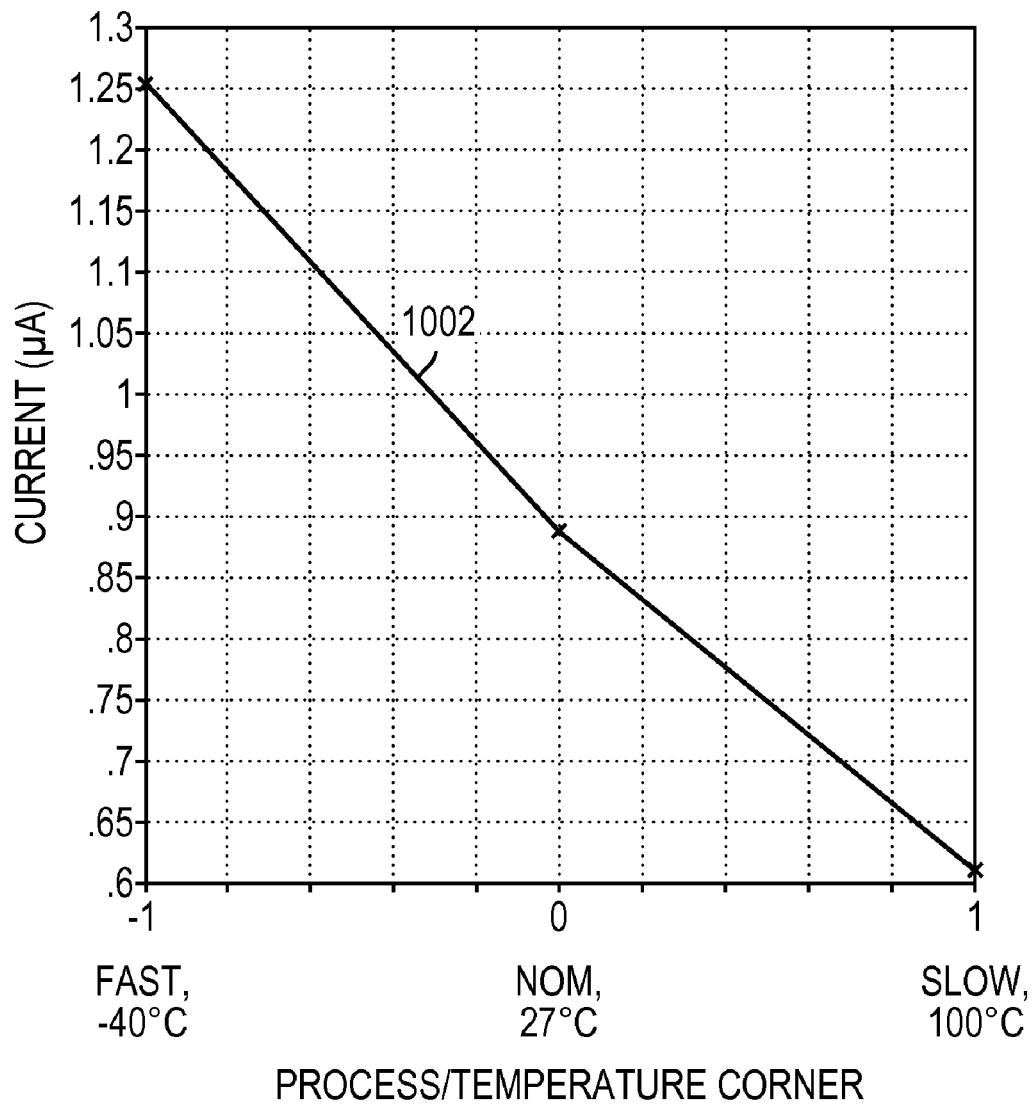
FIGS. 10A-10C are graphs illustrating simulated performance results for a temperature-dependent frequency divider.
Figure 10B:
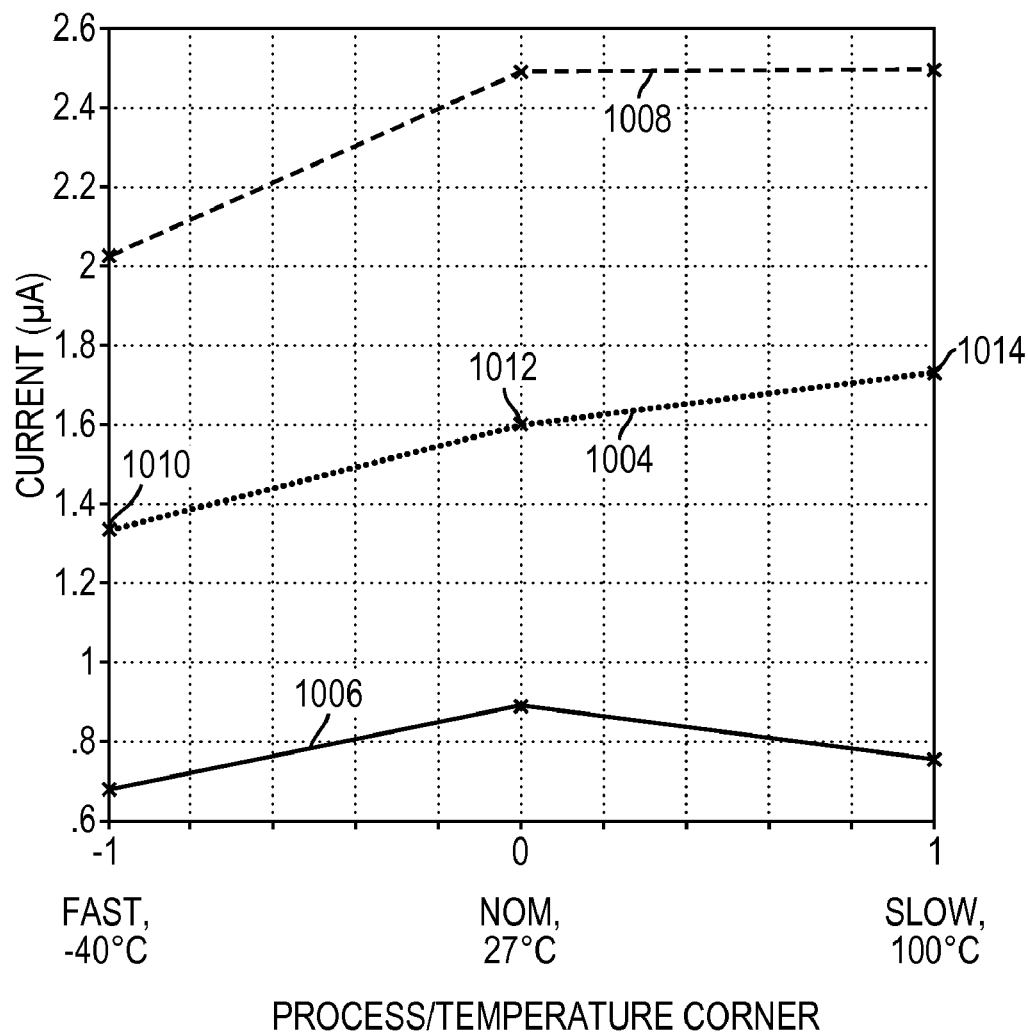
Figure 10C:
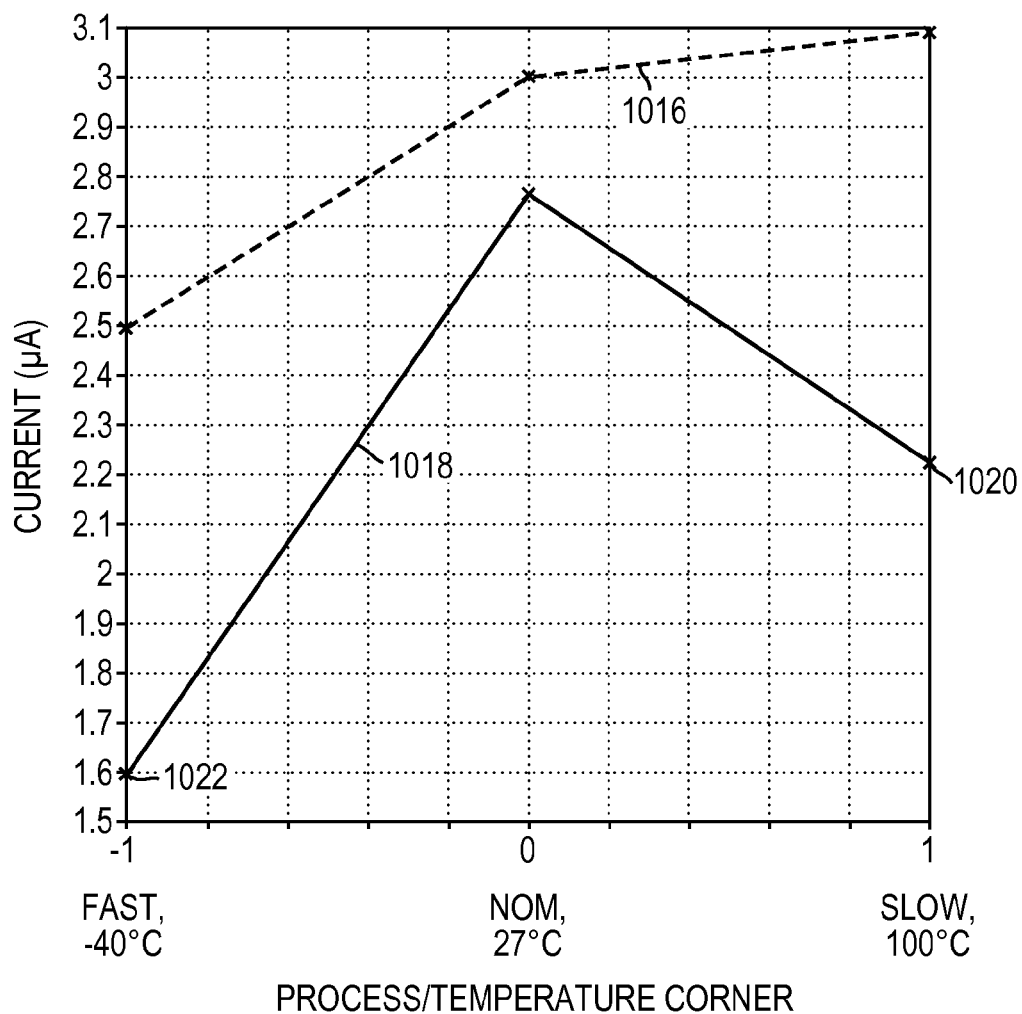

FIGS. 9A-9C and 10A-10C illustrate before-and-after improvements in current consumption performance of the frequency divider 402 using embodiments of the present invention. FIGS. 9A-9C illustrate the current consumption performance, as well as the voltage swing at an LO buffer output, of the frequency divider 402 having a non-shaped bias-current generation. FIGS. 10A-10C show the same parameters for a shaped bias-current generation circuit, in accordance with embodiments of the current invention. In each case, the frequency divider 402 was designed to deliver a 2.2 volts peak-to-peak signal voltage at its output at a worst-case corner (e.g., slow transistors and 100° C. temperature).

FIG. 9A illustrates a graph 902 of the bias voltage 504 generated only by the ZTAT current source 514 (i.e., only the non-temperature dependent current source). The graph 902 shows only a small dependency on the temperature and process corners of about 240 mV (as the bias voltage 504 falls from approximately 840 mV to 600 mV across the range of operating conditions). This small variance is mainly due to variation of the output resistance of the current mirrors used in the design.

FIG. 9B illustrates the current consumption of the frequency divider and of the LO buffers 114 used to drive the receiver mixer 116 using the voltage bias values illustrated in FIG. 9A. The average current consumption 904 of the frequency divider combines with the average current consumption 906 of the LO buffers 114 to produce a total average current consumption 908. The total current consumption 908 decreases in the slow, 100° C. corner 914 relative to the nominal, 27° C. condition 912 and increases by approximately 50% in the fast, 40° C. corner 910. This behavior (less current consumption in the slow process corner 914 and more current consumption in the fast process corner 910) is typical for all prior-art frequency divider circuits that have no bias current control. In these prior-art circuits, the bias current is determined by the individual transistors' transconductances which decreases in the slow process corner 914 and increases in the fast process corner 910.

The behavior of the current consumption shown in FIG. 9B runs counter to the desired direction of current consumption in the frequency divider 402. Ideally, more current may be available in the slow process corner 914 (to compensate the effects of slower transistors at that corner) and less current is available in the fast process corner 910 (to save power consumption). Instead, as FIG. 9B illustrates, the total current consumption 908 of the prior-art frequency divider increases by approximately 50% at the fast process corner 910 relative to the current consumption at the slow process corner 914.

FIG. 9C illustrates the results of this less-than-ideal relationship between bias current and process corner. The voltage swing 916 at the output of the frequency divider and the voltage swing 918 at the output of the LO buffer 114 are shown. As described above, the circuit was designed to deliver 2.2 volts of voltage swing at the worst-case corner 920. Because the bias current rises unnecessarily in the fast process corner 922, however, the voltage swing rises to approximately 3.9 volts. Because only a 2.2 volt peak-to-peak signal voltage swing is necessary to maintain reliable operation of the frequency divider, operation at the fast process corner 922 consumes unnecessary power.

FIGS. 10A-10C illustrate the performance of the frequency divider circuit 402 when bias-current shaping is used in accordance with embodiments of the current invention. FIG. 10A illustrates a graph 1002 of the bias voltage 504 generated using both ZTAT (temperature-independent) and PTAT (temperature-dependent) current sources 514, 512. The value of the graph 1002 decreases by approximately 300 mV in the slow process corner relative to the nominal corner and increases by approximately 350 mV in the fast process corner, for a total difference of approximately 650 mV. This strong temperature dependence in the bias voltage 504 allows the current consumption of the frequency divider 504 to increase in the slow process corner relative to the nominal process corner and decreases in the fast process corner relative to the nominal process corner.

FIG. 10B illustrates the current consumption of the frequency divider 402 and the LO buffers 114. The current consumption 1004 of the frequency divider 402 increases in the slow process corner 1010 relative to the nominal process corner 1012 and decreases in the fast process corner 1014. This behavior allows the frequency divider 402 to save on overall power consumption 1008 by increasing its current consumption in the slow process corner 1014 (in which the circuit needs more supply current to maintain its functionality and output voltage swing) and decreasing the current consumption in the fast process corner 1010 (in which the circuit has excess supply current to maintain its functionality and output voltage swing).

Because the LO buffer 114 current consumption 1006 may not be controlled or shaped, its current consumption 1006 depends at least on its input voltage swing (which is the voltage swing of the frequency divider 402 output) as well as the transconductance of its own transistors. Hence, the frequency divider 402 current consumption 1004 affects the output voltage swing of the LO buffer 114, as shown below in FIG. 10C. As a result of this dependency, the current consumption of the LO buffers 114 decreases in the fast process corner (due to reduced voltage swing output from the frequency divider circuit) and decreases in the slow process corner (due to less transistor transconductance of the LO buffers). Thus, the overall current consumption 1008, which is the sum of the component current consumptions 1004, 1006, stays constant in the slow process corner relative to the nominal process corner and decreases in the fast process corner relative to the nominal process corner. In one embodiment of the invention, the DC bias point of the LO buffers may also be shaped in accordance with temperature to provide even greater savings in power consumption.

The total current consumption 1008 is approximately 2.5 mA at the slow process corner, which is approximately equal to the current consumption 908 of the non-shaped-bias-current circuit at its slow process corner, as shown in FIG. 9B. Using embodiments of the current invention, however, the current consumption saving is approximately 0.6 mA at the nominal process corner (2.5 mA in FIG. 10B versus 3.1 mA in FIG. 9B) and approximately 1.7 mA at the fast process corner (2.0 mA in FIG. 10B versus 3.7 mA in FIG. 9B).

FIG. 10C illustrates the voltage swing 1016 at the output of the frequency divider 402 as well as the voltage swing 1018 at the output of the LO buffers 114. At the slow process corner 1020, the output voltage of the LO buffer achieves the desired 2.2 volt peak-to-peak voltage swing. In the fast process corner 1022, the output voltage of the LO buffer drops to a 1.6 volt peak-to-peak voltage swing, which is sufficient (at the fast process corner) for the receiver to maintain its performance.

Two frequency dividers 402 may be needed in either receive or transmit modes (e.g., one for the frequency synthesizer and one for the receiver mixer or the transmitter power amplifier). Using the bias current shaping technique in accordance with embodiments of the present invention, a savings of 1.2 mA current consumption (i.e., 8% of the total current of a 15 mA receiver) may be achieved under nominal conditions. In a similar 15 mA receiver, across all process and temperature corners, this savings may amount to approximately 3.4 mA. Table 1, shown below, summarizes the current consumption savings achieved.

TABLE 1

Summary of Current Consumption Saving

|  | Frequency Divider Current Consumption Saving | LO Buffer Current Consumption Saving | Increase in VCO Current Due to Excess Resistive and Capacitive Loading | Total Current Consumption Saving |
| --- | --- | --- | --- | --- |
| Nominal Corner | 1.2 mA | 5.0 mA | 0.1 mA | 6.1 mA |
| All Corners | 3.4 mA | 6.0 mA | 0.1 mA | 9.3 mA |

In one embodiment, a temperature sensor may be used to measure the chip or ambient temperature and adjust the bias current of the frequency divider 402 accordingly. A lookup table may be used to program an appropriate bias current in the frequency divider 402, via the inputs 518, based on the measured chip temperature. The values to be used in the lookup table may be obtained from measurements of the manufactured silicon. The temperature sensor data may be used to override the temperature-dependent current as determined by the PTAT current source 512 and, thus, the temperature sensitivity of the bias generator circuit 500 may be determined solely by the temperature sensor data. The temperature sensor data may be read at periodic intervals to thereby provide the means for periodic bias current updates. In other embodiments, the output 520 of the bias generator circuit 500 is determined by a combination of the temperature sensor data and of the current output by the PTAT current source 512. For example, the temperature sensor data may define a lower or upper bound on the generated bias current. The inclusion of the temperature sensor data, by providing real-time temperature measurements, may allow an even further reduction in current consumption.

In another embodiment, a frequency measurement circuit may be used to measure the frequency (or a divided-down version of the frequency) output by the frequency divider 402 against a reference frequency and adjust the programmable bias current accordingly until the divider frequency matches the reference frequency. For example, if the measured frequency is too low, the frequency measurement circuit may direct the DAC 516 to increase the bias current, and vice versa. The point at which the frequencies match may be the point of minimum power consumption for the frequency divider. The frequency measurement circuit may be used instead of, or in addition to, the temperature-dependent current or voltage source to reduce power consumption.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A bias-shaping circuit comprising:
   an input node configured to receive an input signal directly from an output of a voltage-controlled oscillator;
   a temperature-dependent bias source configured to produce a temperature-dependent bias; and
   a summing circuit configured to produce an output bias comprising a sum of at least a portion of the input signal and the temperature-dependent bias, the summing circuit configured to provide the output bias to a frequency divider, the output bias responsive to a change in temperature to compensate for at least a portion of a temperature-induced change in the frequency divider, thereby adjusting power consumption in the frequency divider to substantially a temperature-dependent minimum.

2. The bias-shaping circuit of claim 1, wherein the change in temperature comprises one of a decrease in temperature or an increase in temperature.

3. The bias-shaping circuit of claim 1, wherein the temperature-dependent bias source is one of a voltage source or a current source.

4. The bias-shaping circuit of claim 1, wherein a bias value of the temperature-dependent bias source varies in accordance with a received control value.

5. The bias-shaping circuit of claim 1, further comprising a look-up table for varying the bias value of the temperature-dependent bias source based on a measured temperature.

6. A bias-shaping circuit comprising:
   an input node configured to receive an input signal from a voltage-controlled oscillator through one of an impedance-transformation network or local-oscillator distribution lines;
   a temperature-dependent bias source configured to produce a temperature-dependent bias; and
   a summing circuit configured to produce an output bias comprising a sum of at least a portion of the input signal and the temperature-dependent bias, the summing circuit configured to provide the output bias to a frequency divider, the output bias responsive to a change in temperature to compensate for at least a portion of a temperature-induced change in the frequency divider, thereby adjusting power consumption in the frequency divider to substantially a temperature-dependent minimum.

7. The bias-shaping circuit of claim 6, wherein the temperature-induced change in the frequency divider comprises at least one of a change in a rise time of an output of the frequency divider, a change in a fall time of the output of the frequency divider, or a change in a magnitude of a voltage swing of the output of the frequency divider.

8. The bias-shaping circuit of claim 7, wherein compensating for at least a portion of the temperature-induced change comprises at least one of maintaining the rise time, maintaining the fall time, or maintaining the magnitude of the voltage swing.

9. The bias-shaping circuit of claim 7, wherein compensating for at least a portion of the temperature-induced change comprises at least one of increasing the rise time, increasing the fall time, or decreasing the magnitude of the voltage swing.

10. The bias-shaping circuit of claim 6, wherein the output bias is one of an output voltage or an output current.

11. The bias-shaping circuit of claim 6, wherein the input signal is attenuated to a desired level.

12. A bias-shaping circuit comprising:
   an input node configured to receive an input signal;
   a temperature-dependent bias source configured to produce a temperature-dependent bias; and
   a summing circuit configured to produce an output bias comprising a sum of at least a portion of the input signal and the temperature-dependent bias, the summing circuit configured to provide the output bias to a frequency divider, the output bias responsive to a change in temperature to compensate for at least a portion of a temperature-induced change in the frequency divider, thereby adjusting power consumption in the frequency divider to substantially a temperature-dependent minimum,
   wherein the input signal is received from a buffer comprising:
      a second temperature-dependent bias source configured to produce a second temperature-dependent bias; and
      a second summing circuit configured to produce a second output bias comprising a sum of at least a portion of a buffer input signal and the second temperature-dependent bias, the second summing circuit configured to provide the second output bias to the buffer for control thereof, the second output bias responsive to the change in temperature to compensate for at least a portion of a temperature-induced change in the buffer, thereby adjusting power consumption in the buffer to substantially a temperature-dependent minimum.

13. The bias-shaping circuit of claim 12, wherein the portion of the input signal comprises an AC component of the input signal.

14. The bias-shaping circuit of claim 12, wherein the frequency divider comprises a D-type flip-flop.

15. The bias-shaping circuit of claim 12, wherein the input signal comprises a non-rail-to-rail time-varying signal.

16. A method of adjusting power consumption in a frequency divider, the method comprising:
   receiving an input signal directly from a local oscillator;
   producing a temperature-dependent bias;
   combining at least a portion of the input signal and the temperature-dependent bias to thereby create an output bias; and
   controlling a frequency divider with the output bias to thereby compensate for at least a portion of a temperature-induced change in the frequency divider, thereby adjusting power consumption in the frequency divider to substantially a temperature-dependent minimum.

17. The method of claim 16, wherein the temperature-induced change comprises at least one of a change in a rise time of an output of the frequency divider, a change in a fall time of the output of the frequency divider, or a change in a magnitude of a voltage swing of the output of the frequency divider.

18. The method of claim 17, wherein compensating for at least a portion of the temperature-induced change comprises at least one of maintaining the rise time, maintaining the fall time, or maintaining the magnitude of the voltage swing.

19. The method of claim 17, wherein compensating for at least a portion of the temperature-induced change comprises at least one of increasing the rise time, increasing the fall time, or decreasing the magnitude of the voltage swing.

20. The method of claim 16, wherein the portion of the input signal comprises an AC component of the input signal.

21. A method of adjusting power consumption in a frequency divider, the method comprising:
   receiving an input signal from the voltage-controlled oscillator through one of an impedance-transformation network or local-oscillator distribution lines;
   producing a temperature-dependent bias;
   combining at least a portion of the input signal and the temperature-dependent bias to thereby create an output bias; and
   controlling a frequency divider with the output bias to thereby compensate for at least a portion of a temperature-induced change in the frequency divider, thereby adjusting power consumption in the frequency divider to substantially a temperature-dependent minimum.

22. The method of claim 21, wherein the input signal comprises a non-rail-to-rail time-varying signal.

23. The method of claim 21, further comprising attenuating the input signal to a desired level.

24. The method of claim 21, further comprising modifying the temperature-dependent bias in accordance with an output of a sensor.

25. The method of claim 24, wherein the sensor comprises at least one of a temperature sensor or a frequency monitor.

* * * * *